(12) United States Patent
Thompson et al.

(10) Patent No.: US 6,214,122 B1
(45) Date of Patent: Apr. 10, 2001

(54) RAPID THERMAL PROCESSING SUSCEPTOR

(75) Inventors: Danny L. Thompson, Mesa, AZ (US); Bradley M. Melnick, Austin, TX (US); William J. Dauksher, Mesa, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 08/819,162

(22) Filed: Mar. 17, 1997

(51) Int. Cl.[7] .................................................. C23C 16/00
(52) U.S. Cl. ............................. 118/729; 118/728; 118/500
(58) Field of Search .................................. 118/724, 500, 118/725, 728, 729; 302/418; 432/253, 259

(56) References Cited

U.S. PATENT DOCUMENTS

| | | | |
|---|---|---|---|
| 4,978,567 | * 12/1990 | Miller | 428/157 |
| 5,238,499 | 8/1993 | Van de Ven et al. | 118/724 |
| 5,580,388 | * 12/1996 | Moore | 118/728 |
| 5,863,843 | * 1/1999 | Green et al. | 438/771 |

* cited by examiner

Primary Examiner—Deborah Jones
Assistant Examiner—Lymarie Miranda
(74) Attorney, Agent, or Firm—Eugene A. Parsons; William E. Koch

(57) ABSTRACT

A rapid thermal processing susceptor including a base having a planar surface and an upright sidewall extending around a periphery thereof and encircling a working portion of the planar surface. The working portion and the sidewall define a cavity. A plurality of minimum contact points extend from the working portion into the cavity and are positioned to receive thereon a semiconductor wafer. A cover is receivable by the sidewall for enclosing the cavity.

17 Claims, 6 Drawing Sheets

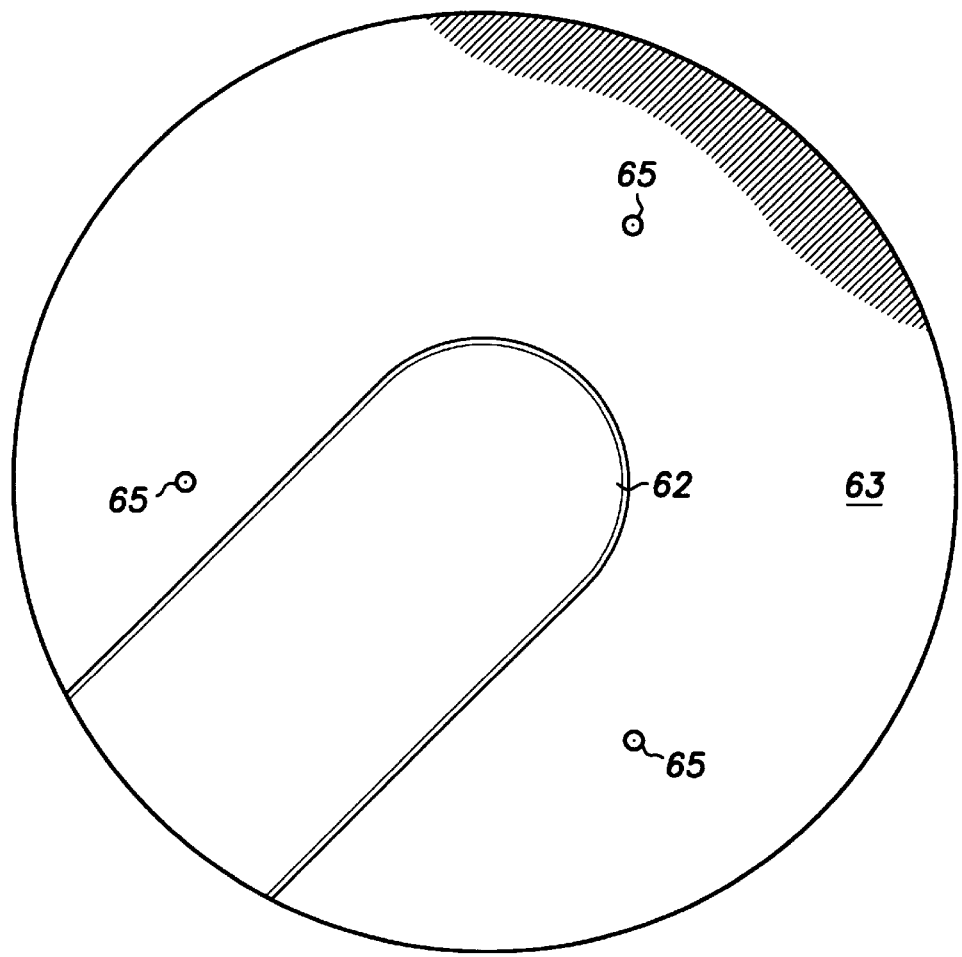
*60* FIG. 7
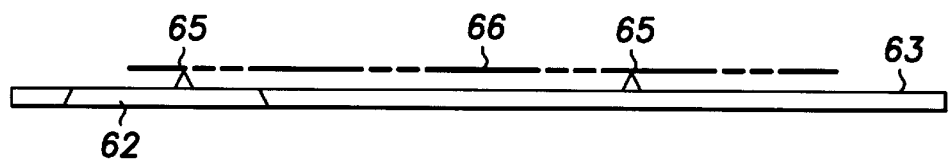
*60* FIG. 8
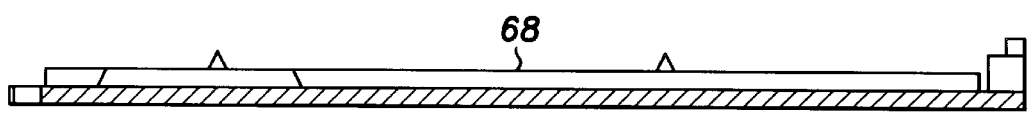
FIG. 9

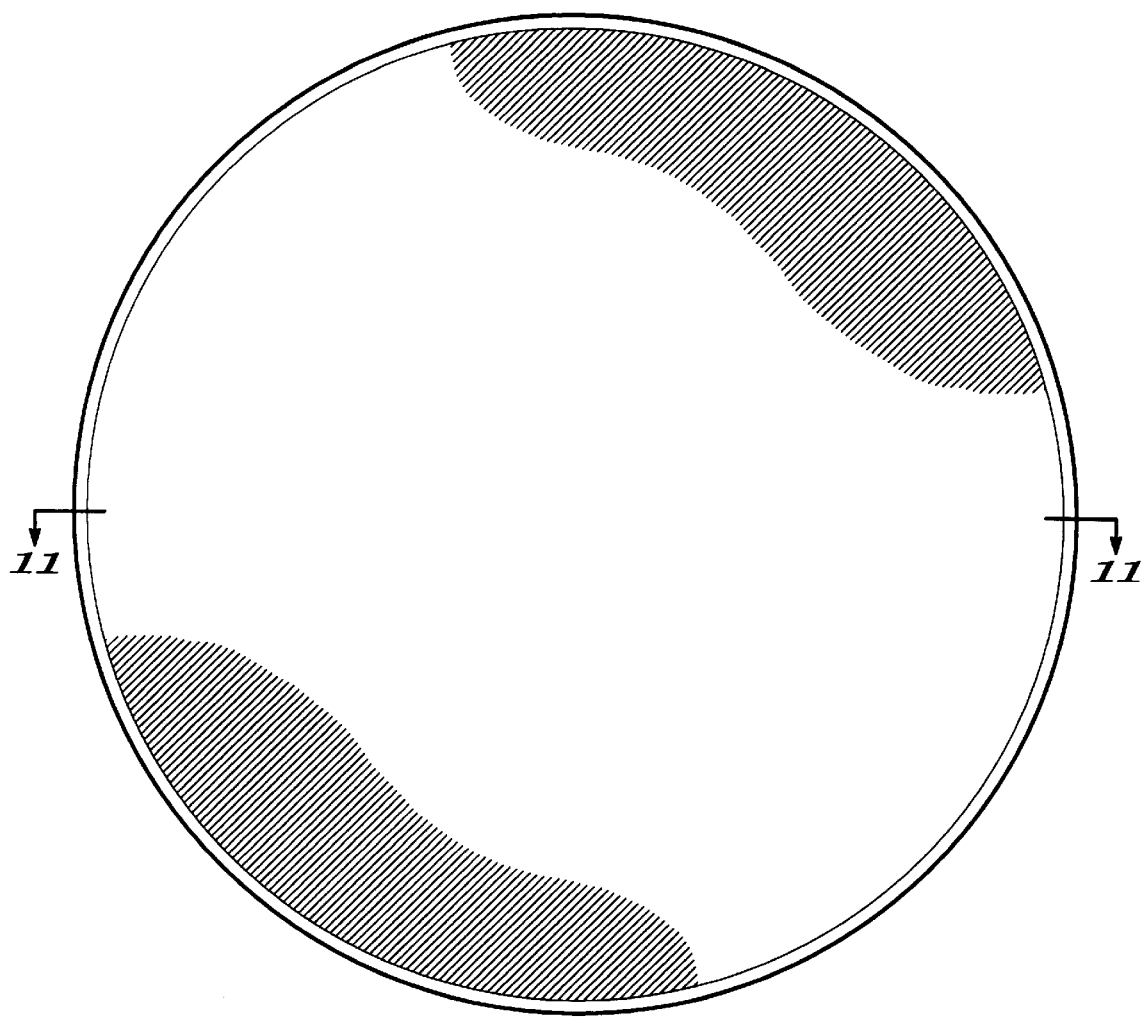
70  FIG. 10
70  FIG. 11

RAPID THERMAL PROCESSING SUSCEPTOR

FIELD OF THE INVENTION

The present invention pertains to rapid thermal processing of semiconductor substrates and more specifically to platforms for supporting and transferring heat to the substrate.

BACKGROUND OF THE INVENTION

In the fabrication of semiconductor devices, temperature treatment of the semiconductor substrate (herein after referred to as a wafer) is a necessary process step. Rapid thermal processing is often used during the processing of semiconductor devices for annealing materials, curing layers and activating compounds to name a few, and performed in a rapid thermal process tool. While effective in heating the wafer, the radiation pattern from the heating elements of the tool causes temperature variations in the material of the wafer. Temperature variations in the wafer cause, for example, material phase differences, doping nonuniformities, and stress gradients which are detrimental to the fabrication process.

The temperature variations are reduced by providing a susceptor carrying the wafer. A conventional susceptor is a container having a flat bottom upon which the wafer is placed. A lid is used to reduce convection currents near the wafer so the wafer is heated by transfer of heat from the bottom of the susceptor. The use of a susceptor minimizes temperature variations in the substrate. However, in very sensitive materials, temperature variations result from mechanical contact between the susceptor and the wafer, with flatness of the susceptor being critical to insure good mechanical contact which results in uniform thermal distribution. Any unevenness in the susceptor or the wafer will result in non-uniform thermal contact and temperature variation.

It would be highly advantageous, therefore, to remedy the foregoing and other deficiencies inherent in the prior art.

Accordingly, it is an object of the present invention to provide an new improved rapid thermal processing susceptor.

Another object of the present invention is to provide a rapid thermal processing susceptor which improves thermal uniformity and reproducibility of the temperature in wafers.

And another object of the present invention is to provide a rapid thermal processing susceptor which minimizes the thermal contact area between susceptor and wafer.

Still another object of the present invention is to provide a rapid thermal processing susceptor which minimizes backside contamination and cross contamination of wafers.

Yet another object of the present invention is to provide a rapid thermal processing susceptor in which the dimensions can be manipulated in specific applications to heat the surfaces of a wafer differently.

And still another object of the present invention is to provide a rapid thermal processing susceptor which improves the gas flow within the susceptor.

A further object of the present invention is to provide a rapid thermal processing susceptor which can be employed with an automated rapid thermal processing tool.

SUMMARY OF THE INVENTION

Briefly, to achieve the desired objects of the instant invention, in accordance with a preferred embodiment thereof, provided is a rapid thermal processing susceptor including a base having a planar surface and an upright sidewall extending around a periphery thereof and encircling a working portion of the planar surface. The working portion and the sidewall define a cavity. A plurality of minimum contact points extend from the working portion into the cavity and are positioned to receive thereon a semiconductor wafer. A cover is receivable by the sidewall for enclosing the cavity.

In accordance with a further embodiment of the invention, provided is a rapid thermal processing susceptor for use in an automated rapid thermal processing tool. The susceptor includes a base having an upright sidewall extending around the periphery thereof and defining a cavity. A plurality of lift mechanism receiving openings are formed through the base, and a plug is positioned in the cavity and has an upper surface. An insert having a cut-out and an upper surface is movable between a raised position and a lowered position. In the lowered position the insert is positioned in the cavity with the plug received in the cut-out and the upper surface of the plug and the upper surface of the insert defining a planar surface within the cavity. A plurality of minimum contact points extend from the upper surface of the insert and are positioned to receive thereon a semiconductor wafer. A cover is receivable by the sidewall for enclosing the cavity.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which:

FIG. 7 is a top plan view of another portion of the embodiment of the susceptor of FIG. 5;

FIG. 8 is a side elevational view of the portion of FIG. 7;

FIG. 9 is a sectional view illustrating the portions of FIGS. 5 and 7, with the portion of FIG. 7 in the lowered position;

FIGS. 10 and 11 are top plan and side elevational views of a cover for the structure of FIG. 5.

DESCRIPTION OF THE PREFERRED EMBODIMENTS

Figure 1:
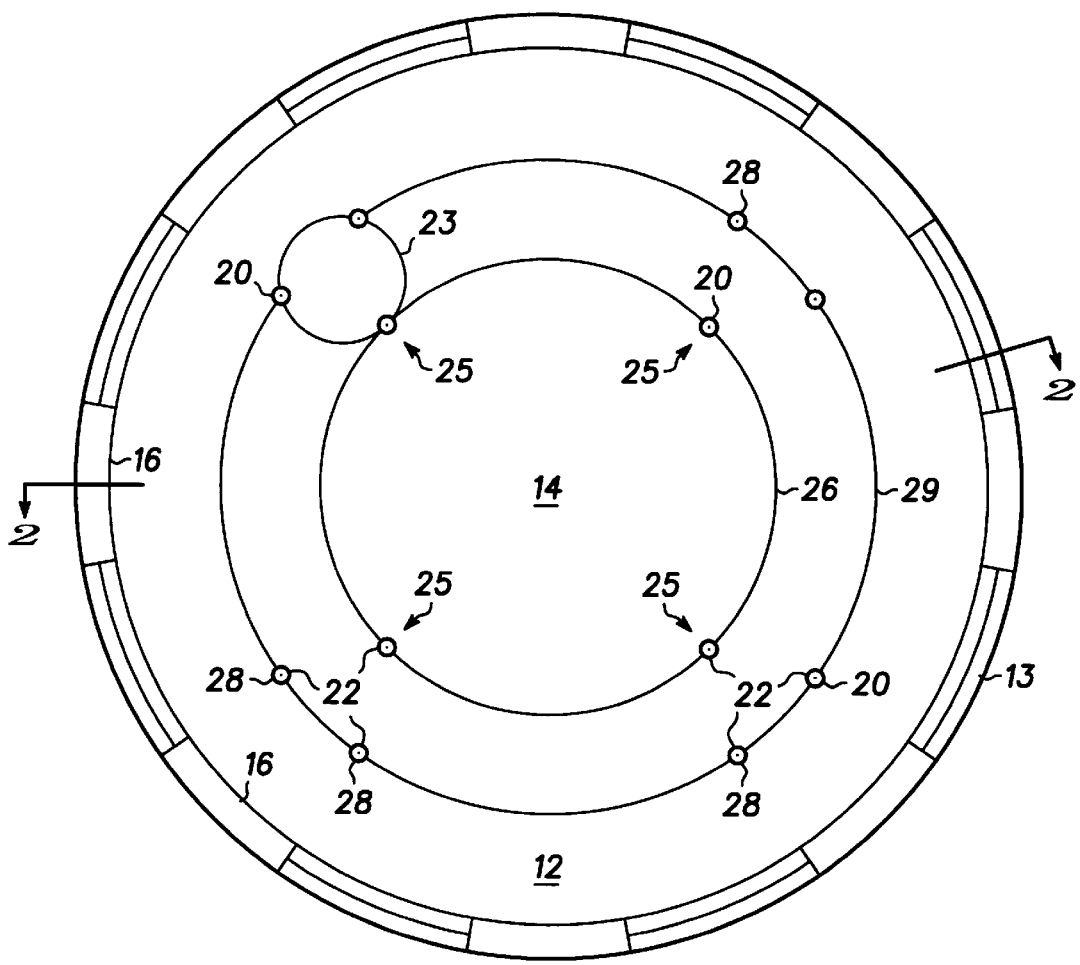
FIG. 1 is a top plan of a portion of a susceptor in accordance with the present invention.
Figure 2:
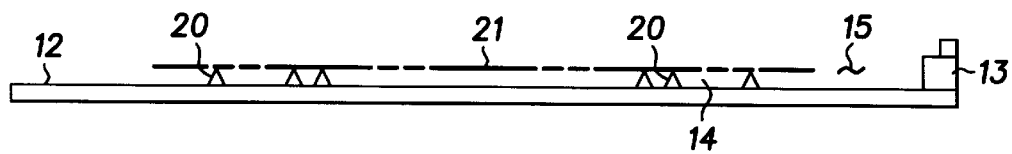
FIG. 2 is a sectional view taken along the line 2—2 of FIG. 1.

Turning now to the drawings in which like reference characters indicate corresponding elements throughout the several views attention is first directed to FIGS. 1 and 2 which illustrate a base 10 of a rapid thermal processing susceptor in accordance with the present invention. Base 10 includes a planar surface 12 and an upright sidewall 13 extending around a periphery thereof and encircling a working portion 14 of planar surface 12. Working portion 14 and sidewall 13 define a cavity 15. In this embodiment, a plurality of vent openings 16 are formed in sidewall 13 substantially evenly spaced about the periphery of base 10 to provide for adequate gas flow in specific applications and uniform heat distribution within cavity 15 as will be understood.

A plurality of minimum contact points 20 extend from working portion 14 into cavity 15. Minimum contact points 20 are positioned to receive and support a semiconductor wafer above planar surface 12, as illustrated generally by phantom line 21 in FIG. 2. Minimum contact points 20 preferably have a base with a diameter of not greater than 0.025 inches and a height of approximately 0.020 inches, and may be one of cylinders, cones and bumps. In this specific embodiment, minimum contact points 20 are 45 degree cones. Regardless of the specific form of contact points 20, their function is to support a wafer off planar surface 12 a fixed distance with a minimum of mechanical contact therebetween thereby minimizing the thermal contact area. By minimizing the mechanical contact between the wafer and the susceptor, heat is transferred uniformly by radiant transfer instead of non-uniform patterns of thermal conduction. By minimizing contact between the susceptor and the wafer, backside contamination and cross contamination of the wafer is reduced. In addition, by using minimum contact points 20, surface treatment of some materials is enhanced because black body radiation, or radiant heating, can be manipulated to heat the wafer more from the top (wafer front) than from the bottom (wafer back) and can increase activation of dopants while helping to control diffusion.

The plurality of minimum contact points 20 are positioned in a plurality of groups arranged to receive a plurality of wafers. As an example, four groups 22 of three minimum contact points 20 are each arranged to define a 0.75 inch diameter circle 23 to receive four one inch wafers simultaneously. This arrangement also provides a single group 25 of minimum contact points 20 positioned concentrically with a center point of working portion 14. Single group 25 is arranged to define a 2.70 inch diameter circle 26 to receive a three inch wafer. Furthermore, this arrangement also provides another single group 28 of minimum contact points 20 positioned concentrically with a center point of working portion 14. Single group 28 is arranged to define a 3.50 inch diameter circle 29 to receive a four inch or larger wafer. It should be understood that this arrangement is for purposes of example, and that other arrangements can be utilized.

Figure 3:
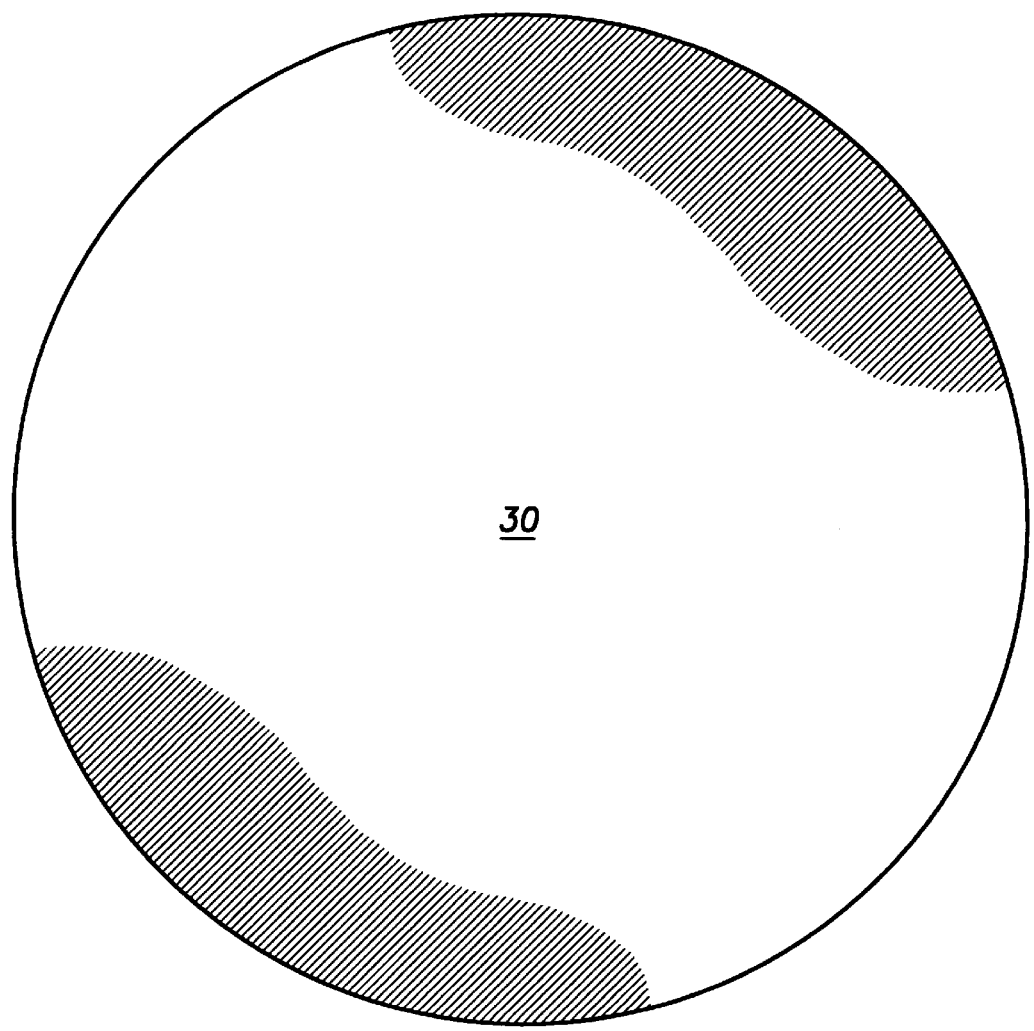
FIGS. 3 and 4 are top plan and side elevational views of a cover for the structure of FIG. 1.
Figure 4:

A cover 30, as seen in FIGS. 3 and 4, is receivable by sidewall 13 for enclosing cavity 15. Cover 30 is designed to mate with sidewall 13 of base 10 and cooperate with base 10 to provide uniform heating within cavity 15. The height of minimum contact points 20 is selected to support a wafer a fixed distance above working surface 14 and to control the space gap to cover 30.

Figure 5:
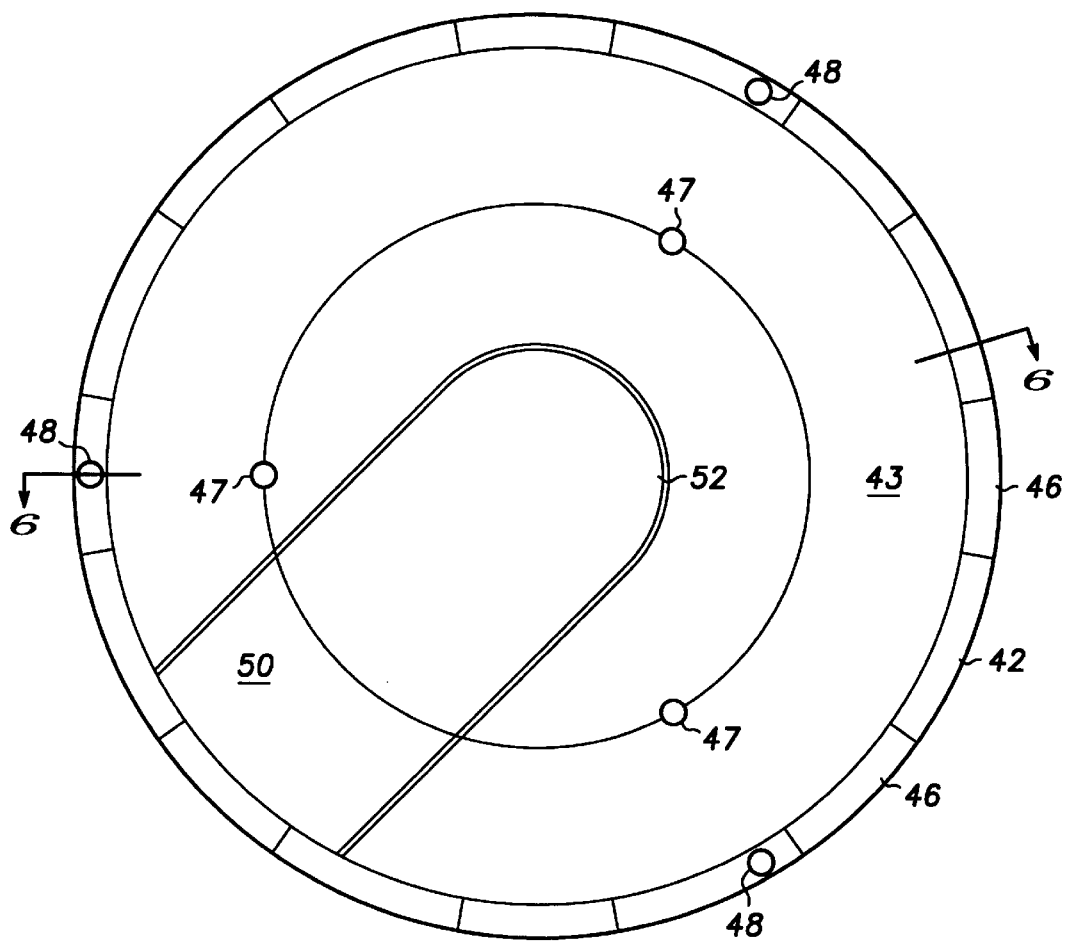
FIG. 5 is a top plan view of a portion of another embodiment of a susceptor in accordance with the present invention.
Figure 6:
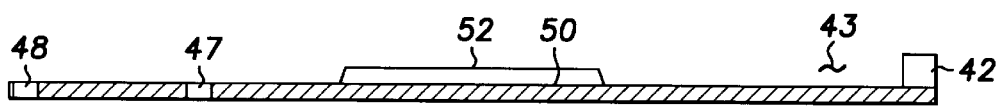
FIG. 6 is a sectional view taken along line 6—6 of FIG. 5.

Turning now to FIGS. 5 and 6, a base 40 of another embodiment of a susceptor for use in an automated rapid thermal processing tool in accordance with the present invention is illustrated. Base 40 includes an upright sidewall 42 extending around the periphery thereof and defining a cavity 43. In this embodiment, a plurality of vent openings 46 are formed in sidewall 42 substantially evenly spaced about the periphery of base 40 to provide for adequate gas flow in specific applications and uniform heat distribution within cavity 43 as will be understood.

A plurality of lift mechanism receiving openings are formed through base 40. A first group 47 of lift mechanism receiving openings are formed through base 40 in communication with cavity 43 for communication with an insert, which will be explained presently, and a second group 48 of the lift mechanism receiving openings are formed through base 40 and extend through sidewall 42 for communication with a cover, which will be explained presently. A plug 50 having an upper surface 52, is positioned on the surface of base 40 in cavity 43. It should be understood that plug 50 can be formed integrally with base 40 or it can be formed separately and affixed to base 40. Plug 50 extends from the perimeter of base 40 to slightly beyond a center point for purposes which will be explained presently.

Referring now to FIGS. 7 and 8, an insert 60 having a cut-out 62 and an upper surface 63 is illustrated. A plurality of minimum contact points 65 extend from surface 63 of insert 60. Minimum contact points 65 are positioned to receive and support a semiconductor wafer above surface 63, as illustrated generally by phantom line 66 in FIG. 8. Minimum contact points 65 preferably have a base with a diameter of not greater than 0.025 inches and a height of approximately 0.020 inches, and may be one of cylinders, cones and bumps. In this specific embodiment, minimum contact points 65 are 45 degree cones. Regardless of the specific form of contact points 65, their function is to support a wafer off surface 63 a fixed distance with a minimum of mechanical contact therebetween, thereby minimizing the thermal contact area. By minimizing the mechanical contact between the wafer and the susceptor, heat is transferred uniformly by radiant transfer instead of non-uniform patterns of thermal conduction.

With additional reference to FIG. 9, insert 60 is movable between a lowered position as shown and a raised position. In the lowered position, insert 60 is positioned in cavity 43 with plug 50 received in cut-out 62. Upper surface 52 of plug 50 and upper surface 63 of insert 60 define a planar surface 68 within cavity 43. Plug 50 has chamfered sides to facilitate its mating with cut-out 62.

A cover 70, as seen in FIGS. 10 and 11, is receivable by sidewall 42 for enclosing cavity 43. Cover 70 is designed to mate with sidewall 42 of base 40 and cooperate with base 40 to provide uniform heating within cavity 43. The height of minimum contact points 65 is selected to support a wafer a fixed distance above planar surface 68 and to control the space gap to cover 70.

Figure 12:
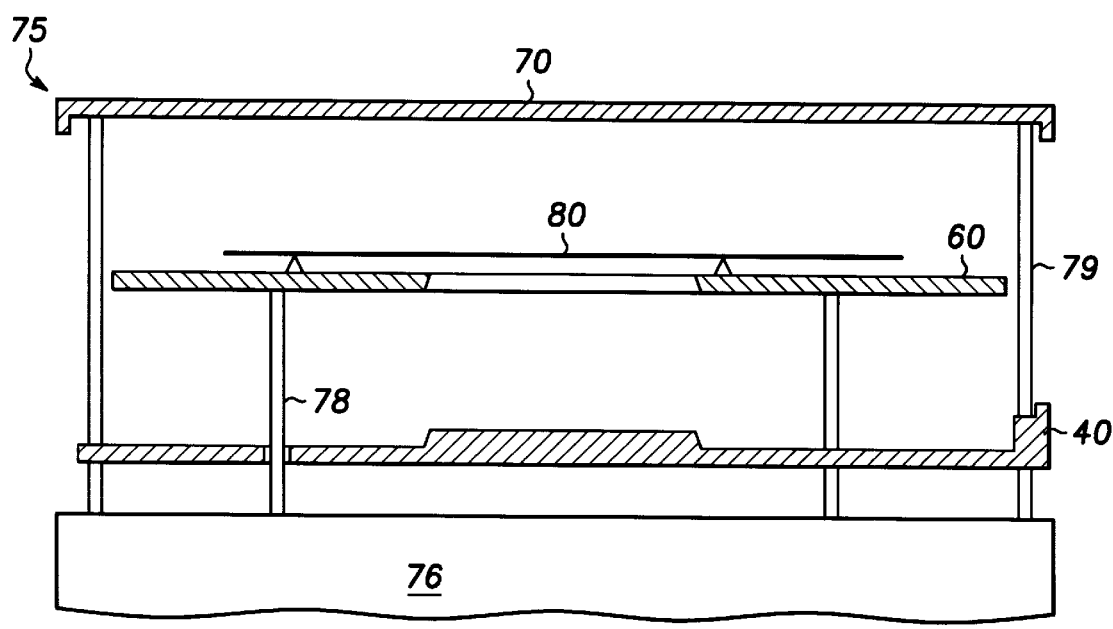
FIG. 12 is a sectional view of the embodiment of FIG. 5, shown in the raised position.

Turning now to FIG. 12, a susceptor 75, which includes base 40, insert 60 and cover 70 as previously described, is illustrated in the raised position and carried by a lift mechanism 76. Lift mechanism 76 includes a first plurality of lift pins 78 and a second plurality of lift pin 79. Pins 78 and 79 are received through lift mechanism receiving openings 47 and 48, respectively. Pins 79 are longer than pins 78 and raise cover 70 a sufficient distance to allow pins 78 to move insert 60 to the raised position. In the raised position, cut-out 62 is removed from engagement with plug 50. Cut-out 62 allows an automated engagement tool to be inserted below a wafer 80. The positioning of the tool permits the automatic insertion and removal of wafer 80 onto minimum contact points 65. Pins 78 and 79 can then be retracted to lower insert 60 and cover 70 for rapid thermal processing.

Accordingly a rapid thermal processing susceptor has been disclosed which improves thermal uniformity and reproducibility of the temperature in wafers during thermal processing by minimizes the thermal contact area between susceptor and wafer. By minimizing the mechanical contact between the wafer and the susceptor, heat is transferred uniformly by radiant transfer instead of non-uniform patterns of thermal conduction. By minimizing contact between the susceptor and the wafer, backside contamination and cross contamination of the wafer is reduced. In addition, by using minimum contact points 20, surface treatment of some materials is enhanced because black body radiation, or radiant heating, can be manipulated to heat the wafer more from the top (wafer front) than from the bottom (wafer back) and can increase activation of dopants while helping to control diffusion. Further, the gas flow within the rapid thermal processing susceptor is improved and a specific embodiment of the rapid thermal processing susceptor can be employed with an automated rapid thermal processing tool.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A rapid thermal processing susceptor comprising:
    a base including a planar surface and an upright sidewall extending around a periphery thereof and encircling a working portion of the planar surface, the working portion and the sidewall defining a cavity;
    a plurality of minimum contact points extending from the working portion into the cavity and positioned to receive thereon a semiconductor wafer, the plurality of minimum contact points being positioned in one of concentric circles about a center of the working position, or at least two sets of three contact points each; and
    a cover receivable by the sidewall for enclosing the cavity.

2. A rapid thermal processing susceptor as claimed in claim 1 wherein the minimum contact points have a base with a diameter of not greater than 0.025 inches.

3. A rapid thermal processing susceptor as claimed in claim 2 wherein the minimum contact points are one of cylinders, cones and bumps.

4. A rapid thermal processing susceptor as claimed in claim 3 wherein the minimum contact points are 45 degree cones.

5. A rapid thermal processing susceptor as claimed in claim 1 wherein the minimum contact points are positioned in a plurality of groups arranged to receive a plurality of wafer sizes.

6. A rapid thermal processing susceptor as claimed in claim 1 wherein the minimum contact points are positioned in a plurality of groups arranged so as to be able to receive a plurality of wafers of different diameters.

7. A rapid thermal processing susceptor as claimed in claim 5 wherein each of the plurality of groups includes a minimum of three minimum contact points.

8. A rapid thermal processing susceptor comprising:
    a base having a planar surface;
    an upright sidewall extending from the periphery of the base and encircling a working portion of the planar surface, the working portion and the sidewall defining a cavity;
    a plurality of minimum contact points extending from the working portion into the cavity and positioned to receive thereon a semiconductor wafer, the minimum contact points are positioned in a plurality of groups of at least three, and arranged to receive a plurality of wafer sizes, the plurality of minimum contact points also being positioned in concentric circles about a center of the working position; and
    a cover receivable by the sidewall for enclosing the cavity.

9. A rapid thermal processing susceptor as claimed in claim 8 wherein the minimum contact points have a base with a diameter of not greater than 0.025 inches.

10. A rapid thermal processing susceptor as claimed in claim 9 wherein the minimum contact points are one of cylinders, cones and bumps.

11. A rapid thermal processing susceptor as claimed in claim 11 wherein the minimum contact points are 45 degree cones.

12. A rapid thermal processing susceptor for use in an automated rapid thermal processing tool, the susceptor comprising:
    a base including an upright sidewall extending around the periphery thereof and defining a cavity, a plurality of lift mechanism receiving openings formed through the base, and a plug positioned in the cavity and having an upper surface;
    an insert having a cut-out and an upper surface, the insert being movable between a raised position and a lowered position, in the lowered position the insert being positioned in the cavity with the plug received in the cut-out with the upper surface of the plug and the upper surface of the insert defining a planar surface within the cavity;
    a plurality of minimum contact points extending from the upper surface of the insert and positioned to receive thereon a semiconductor wafer; and
    a cover receivable by the sidewall for enclosing the cavity, whereas the semiconductor wafer is positioned substantially halfway between the upper surface and the cover.

13. A rapid thermal processing susceptor for use in an automated rapid thermal processing tool as claimed in claim 12, wherein a first group of the lift mechanism receiving openings are formed through the base in communication with the cavity for communication with the insert and a second group of the lift mechanism receiving openings are formed through the base and extend through the sidewall for communication with the cover.

14. A rapid thermal processing susceptor for use in an automated rapid thermal processing tool as claimed in claim 13 wherein the minimum contact points have a base with a diameter of not greater than 0.025 inches.

15. A rapid thermal processing susceptor for use in an automated rapid thermal processing tool as claimed in claim 14 wherein the minimum contact points are one of cylinders, cones and bumps.

16. A rapid thermal processing susceptor for use in an automated rapid thermal processing tool as claimed in claim 15 wherein the minimum contact points are 45 degree cones.

17. A rapid thermal processing susceptor for use in an automated rapid thermal processing tool as claimed in claim 16 wherein the minimum contact points are positioned in concentric circles about a center of the working portion.

* * * * *